(12) United States Patent
Hernando et al.

(10) Patent No.: US 8,995,738 B2
(45) Date of Patent: Mar. 31, 2015

(54) SYSTEM AND METHOD FOR MAGNETIC RESONANCE IMAGING PARAMETRIC MAPPING USING CONFIDENCE MAPS

(71) Applicant: Wisconsin Alumni Research Foundation, Madison, WI (US)

(72) Inventors: Diego Hernando, Madison, WI (US); Scott B. Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 76 days.

(21) Appl. No.: 13/769,682

(22) Filed: Feb. 18, 2013

(65) Prior Publication Data

US 2014/0233817 A1    Aug. 21, 2014

(51) Int. Cl.
   *G06K 9/00*      (2006.01)
   *G06T 11/00*     (2006.01)

(52) U.S. Cl.
   CPC ................................ *G06T 11/003* (2013.01)
   USPC ....................................................... 382/131

(58) Field of Classification Search
   CPC .............................................. G06T 2207/10072
   See application file for complete search history.

(56) References Cited

U.S. PATENT DOCUMENTS

| | | | |
|---|---|---|---|
| 6,064,770 A * | 5/2000 | Scarth et al. .................. | 382/225 |
| 7,924,003 B2 | 4/2011 | Yu et al. | |
| 8,532,353 B2 * | 9/2013 | Salazar-Ferrer et al. ...... | 382/128 |
| 2002/0082495 A1 * | 6/2002 | Biswal et al. .................. | 600/410 |
| 2007/0167727 A1 * | 7/2007 | Menezes et al. .............. | 600/410 |
| 2007/0223794 A1 * | 9/2007 | Preiss et al. ................... | 382/128 |
| 2007/0249929 A1 | 10/2007 | Jeong et al. | |
| 2008/0108894 A1 * | 5/2008 | Elgavish et al. ............... | 600/420 |
| 2008/0281184 A1 * | 11/2008 | White ............................ | 600/410 |
| 2009/0105582 A1 * | 4/2009 | Dougherty et al. ........... | 600/420 |
| 2009/0118608 A1 * | 5/2009 | Koay .............................. | 600/410 |
| 2010/0244822 A1 | 9/2010 | Yu et al. | |
| 2010/0274117 A1 * | 10/2010 | Gunther et al. ............... | 600/410 |
| 2011/0044524 A1 * | 2/2011 | Wang et al. .................... | 382/131 |
| 2011/0140696 A1 | 6/2011 | Yu | |
| 2011/0254547 A1 * | 10/2011 | Reeder et al. ................. | 324/309 |
| 2011/0268332 A1 * | 11/2011 | Hofstetter et al. ............. | 382/131 |
| 2012/0051664 A1 * | 3/2012 | Gopalakrishnan et al. ... | 382/294 |
| 2012/0194189 A1 * | 8/2012 | Sun ............................... | 324/309 |
| 2013/0033262 A1 * | 2/2013 | Porter ........................... | 324/309 |
| 2014/0226888 A1 * | 8/2014 | Skidmore ...................... | 382/131 |

OTHER PUBLICATIONS

Derek K. Jones, Carlo Pierpaoli, "Confidence mapping in diffusion tensor magnetic resonance imaging tractography using a bootstrap approach" Magn. Reson. Med., 53 (May 2005), pp. 1143-1149.*
Hernando, et al., R2* Estimation in the Presence of Fat and Macroscopic B0 Field Variations, ISMRM, 2011, 1 page.
Hernando, et al., R2* Mapping in the Presence of Macroscopic B0 Field Variations, Magn. Reson. Med., 2012, 68 (3):830-840.

* cited by examiner

*Primary Examiner* — Aaron W Carter
*Assistant Examiner* — Ian Lemieux
(74) *Attorney, Agent, or Firm* — Quarles & Brady, LLP

(57) ABSTRACT

A method for producing parametric maps using a magnetic resonance imaging (MRI) system is provided. The MRI system is used to acquire k-space data from a field-of-view. A series of images is reconstructed from the acquired k-space data, and a confidence map is produced using the k-space data. The confidence map depicts regions in the field-of-view that are affected by error sources. A parametric map is produced using the reconstructed series of images and the produced confidence map. Values in the parametric map associated with regions in the field-of-view depicted in the confidence map as being affected by error sources are not computed, thereby reducing errors in the parametric map.

12 Claims, 2 Drawing Sheets

SYSTEM AND METHOD FOR MAGNETIC RESONANCE IMAGING PARAMETRIC MAPPING USING CONFIDENCE MAPS

STATEMENT REGARDING FEDERALLY SPONSORED RESEARCH

This invention was made with government support under DK083380, DK088925, and EB010384 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for improved parametric mapping with MRI.

MRI uses the nuclear magnetic resonance phenomenon to produce images. When a substance, such as human tissue, is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\omega$. If the substance, or tissue, is subjected to a so-called excitation electromagnetic field, $B_1$, that has a frequency near the Larmor frequency, the net aligned magnetic moment, referred to as longitudinal magnetization, may be rotated, or "tipped," into the transverse plane to produce a net transverse magnetic moment, referred to as transverse magnetization. A magnetic resonance signal is emitted by the excited nuclei or "spins," after the excitation field, $B_1$, is terminated, and this signal may be received and processed to form an image.

Magnetic resonance parametric mapping is a general framework for measuring physically meaningful biomarkers. In general, parametric mapping includes obtaining several images from the same field-of-view using different acquisition parameters, such as echo time, repetition time, flip angle diffusion weighting gradients, motion encoding gradients, and so on. These different acquisition parameters give rise to images where the contrast varies in a controlled way. For example, in chemical-shift encoded imaging, several images are acquired with different echo times, which gives rise to different relative phases between distinct chemical species.

A map of a desired parameter is then produced from the image series. The desired parameter is typically mapped by fitting a signal model to the acquired images at each voxel. For instance, in chemical-shift encoded imaging, fat-water separation and $R^*_2$ measurements can be obtained from the acquired images.

Parametric mapping has a number of important applications in MRI, including mapping of contrast dynamics, diffusion, quantification of fat and iron, functional blood oxygen level dependent imaging, and so on. However, parametric mapping is negatively affected by the presence of image artifacts and noise. These effects can introduce systematic errors in certain areas of the parameter maps.

It would therefore be desirable to identify these areas to avoid performing measurements in locations where the measured parameter values are unreliable.

SUMMARY OF THE INVENTION

The present invention overcomes the aforementioned drawbacks by providing a method for identifying sources of parametric mapping errors and producing parametric maps without information from the error sources confounding the parametric maps.

It is an aspect of the invention to provide a method for producing parametric maps using a magnetic resonance imaging ("MRI") system. The MRI system is used to acquire k-space data from a subject positioned in a field-of-view. A series of images is reconstructed from the acquired k-space data. A confidence map is also produced using the k-space data. For instance, the confidence map is produced from the series of images that was reconstructed from the k-space data. The confidence map depicts regions in the field-of-view that are affected by error sources. A parametric map is produced using the reconstructed series of images. Values in the parametric map associated with regions in the field-of-view depicted in the confidence map as being affected by error sources may be not computed, thereby removing areas that contain undesirable errors in the parametric map. Alternatively, values in the parametric map associated with regions in the field-of-view depicted in the confidence map as being affected by error sources may be masked or flagged so as to flag those areas that contain unacceptable errors in the parametric map. The confidence maps can be used to overlay or mask the parametric map or can be produced and displayed separately from the parametric maps.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A method for improved parametric mapping using magnetic resonance imaging ("MRI") is provided. The method includes computing "confidence maps" using the acquired magnetic resonance signals and a signal model. These confidence maps may be overlaid on the parametric maps to help users avoid taking measurements in problematic areas of the parametric maps. In some instances, the acquired magnetic resonance signal itself allows for the characterization of the properties of the measured parametric maps. This characterization can be used as a guide to avoid making measurements in unreliable areas of the parametric map.

Figure 1:
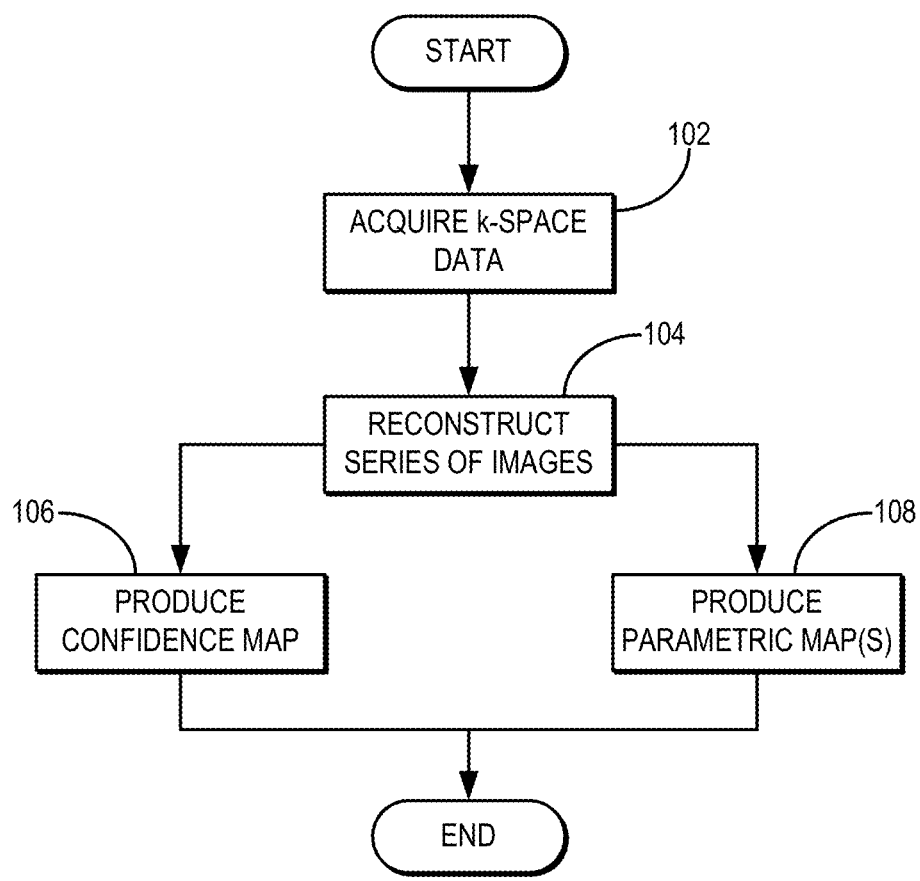
FIG. 1 is a flowchart setting forth the steps of an example of a method for reducing errors in parametric maps using a confidence map that depicts regions in the imaging field-of-view that are contaminated by error sources.

Referring to FIG. 1, a flowchart setting forth the steps of an example of a method for reducing errors in parametric maps using a confidence map that depicts regions of error sources in a field-of-view is illustrated. The method begins with the acquisition of k-space data, as indicated at step 102. By way of example, the k-space data are representative of a series of images acquired with different acquisition parameters. For instance, the k-space data may be acquired using different echo times, repetition time, flip angles, diffusion weightings, motion encodings, and so on. The series of images represented by the k-space data may, therefore, be used to produce parametric maps. After the k-space data are acquired, a series of images is reconstructed from the k-space data, as indicated at step 104.

Next, a confidence map is produced, as indicated at step 106. The confidence map is preferably produced from the reconstructed series of images, but, alternatively, the confidence map may also be generated directly from the acquired k-space data. The confidence map depicts those regions in an imaging field-of-view that are contaminated by error sources. For example, the confidence map may indicate regions having rapid magnetic field changes relative to the spatial resolution of the image series. As another example, the confidence map may indicate regions having poor noise performance or where signals fit poorly with a signal model. Thus, the confidence map may be computed in different ways depending on the imaging application. In general, the confidence map is a binary image whose pixels are assigned unit values when the pixel location corresponds to a region in the imaging field-of-view that is contaminated by an error source. Alternatively, those pixels could be assigned values based on a range of weightings that indicate a relative degree of the contamination by the error sources.

By way of example, susceptibility effects, such as may occur at and around tissue-air interfaces including between the liver and lung or liver and stomach, introduce large systematic errors in $R^*_2$ measurements. These errors result from additional signal dephasing that is introduced by macroscopic magnetic field inhomogeneities. If not addressed, these confounding factors introduce clinically relevant errors in $R^*_2$ quantification. Furthermore, these confounding factors can lead to less robust measurements because the apparent $R^*_2$ measurements will depend on the acquisition parameters. Fortunately, the complex magnetic resonance signal allows measurement of $B_0$ fields and the identification of problematic areas with rapid field variations.

Confidence maps for $R^*_2$ mapping in the presence of macroscopic $B_0$ field variations may be calculated as follows. Variations in the $B_0$ field introduce additional decay in the magnetic resonance signal, confounding the measurement of $R^*_2$ decay rates. These field variations can be identified by measuring $B_0$ field maps from the acquired complex-valued signal. Measurements in regions of rapid $B_0$ field variations relative to the imaging resolution can then be avoided using the confidence map. An example situation where this would be applicable is near the dome of the liver or in areas of the liver with high susceptibility, such as from areas adjacent the colon, if thick slices are used for imaging.

In chemical-shift encoded MRI, the simultaneous assessment of fat and iron in tissue can be achieved by performing joint water-fat separation and $R^*_2$ estimation. For moderate $R^*_2$ values, $R^*_2$ relaxation results in a relatively modest signal decay for typical echo time combinations and does not prevent accurate fat quantification. However, for high $R^*_2$ values, such as in areas of severe iron overload, the signal decay is very rapid and will often compromise the ability to separate fat and water. The reason for this is that, for high $R^*_2$ and typical echo times, only one or two echoes will have signal above the noise level. This condition is not sufficient for robust water-fat separation, where three or more echoes are generally needed for $R^*_2$ corrected water-fat separation.

A confidence map for fat quantification in the presence of iron overload may be generated as follows. Iron overload induces very rapid signal decay indicated by high $R^*_2$, which results in poor noise performance for fat quantification. Based on the $R^*_2$ estimates, the noise performance for fat quantification can be calculated using Cramer-Rao bound ("CRB") analysis, and confidence maps generated to avoid measuring in regions of very poor noise performance.

By way of example, a confidence map may also be generated by calculating the residual of the signal fitting stage of a parametric mapping application. The fitting residual values can be measured at each pixel location and can then be correlated with pixel locations in the confidence map. In this manner, those pixel locations with a poor correlation to the signal model used in the parametric mapping process can be removed from consideration so as to limit the effects of error sources at those pixel locations. Thus, regions where the signal model does not fit the measured signal well are identified in the confidence maps, and parametric maps may be computed again while excluding information from those regions identified in the confidence maps.

Parametric maps are produced from the reconstructed series of images, as indicated at step 108. As shown in FIG. 1, the confidence map and the parametric maps may be produced in parallel; however, it will be appreciated by those skilled in the art that these steps may also be performed in serial.

After the confidence map and the parametric maps have been produced, they may be used together to provide information to a clinician about what regions in the parametric maps the clinician can rely on as conveying accurate information about the subject. For example, the parametric maps can be color-coded based on the values in the confidence map to readily warn the clinician about those regions in the parametric maps that contain errors sufficient to render the information in the parametric maps unreliable.

Figure 2:
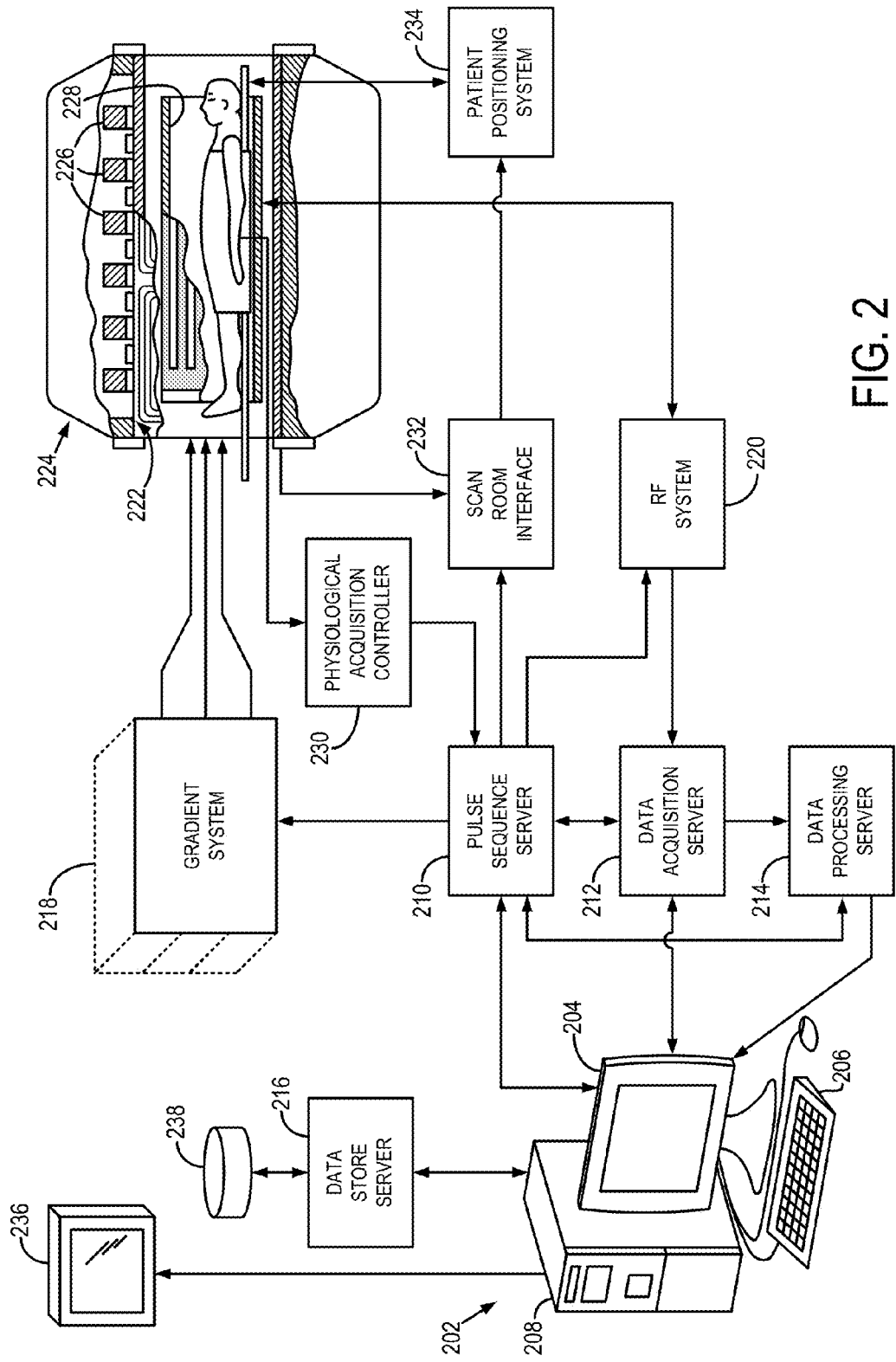
FIG. 2 is a block diagram of an example of a magnetic resonance imaging ("MRI") system.

Referring particularly now to FIG. 2, an example of a magnetic resonance imaging ("MRI") system 200 that may implement the present invention is illustrated. The MRI system 200 includes a workstation 202 having a display 204 and a keyboard 206. The workstation 202 includes a processor 208, such as a commercially available programmable machine running a commercially available operating system. The workstation 202 provides the operator interface that enables scan prescriptions to be entered into the MRI system 200. The workstation 202 is coupled to four servers: a pulse sequence server 210; a data acquisition server 212; a data processing server 214; and a data store server 216. The workstation 202 and each server 210, 212, 214, and 216 are connected to communicate with each other.

The pulse sequence server 210 functions in response to instructions downloaded from the workstation 202 to operate a gradient system 218 and a radio frequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding MR signals. The gradient coil assembly 222 forms part of a magnet assembly 224 that includes a polarizing magnet 226 and a whole-body RF coil 228.

RF excitation waveforms are applied to the RF coil 228, or a separate local coil (not shown in FIG. 2), by the RF system 220 to perform the prescribed magnetic resonance pulse sequence. Responsive MR signals detected by the RF coil 228, or a separate local coil (not shown in FIG. 2), are received by the RF system 220, amplified, demodulated, filtered, and digitized under direction of commands produced by the pulse sequence server 210. The RF system 220 includes an RF transmitter for producing a wide variety of RF pulses used in MR pulse sequences. The RF transmitter is responsive to the scan prescription and direction from the pulse sequence server 210 to produce RF pulses of the desired frequency, phase, and pulse amplitude waveform. The generated RF pulses may be applied to the whole body RF coil 228 or to one or more local coils or coil arrays (not shown in FIG. 2).

The RF system 220 also includes one or more RF receiver channels. Each RF receiver channel includes an RF amplifier that amplifies the MR signal received by the coil 228 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \quad (1);$$

and the phase of the received MR signal may also be determined:

$$\varphi = \tan^{-1}\left(\frac{Q}{I}\right). \quad (2)$$

The pulse sequence server 210 also optionally receives patient data from a physiological acquisition controller 230. The controller 230 receives signals from a number of different sensors connected to the patient, such as electrocardiograph ("ECG") signals from electrodes, or respiratory signals from a bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized MR signal samples produced by the RF system 220 are received by the data acquisition server 212. The data acquisition server 212 operates in response to instructions downloaded from the workstation 202 to receive the real-time MR data and provide buffer storage, such that no data is lost by data overrun. In some scans, the data acquisition server 212 does little more than pass the acquired MR data to the data processor server 214. However, in scans that require information derived from acquired MR data to control the further performance of the scan, the data acquisition server 212 is programmed to produce such information and convey it to the pulse sequence server 210. For example, during prescans, MR data is acquired and used to calibrate the pulse sequence performed by the pulse sequence server 210. Also, navigator signals may be acquired during a scan and used to adjust the operating parameters of the RF system 220 or the gradient system 218, or to control the view order in which k-space is sampled. The data acquisition server 212 may also be employed to process MR signals used to detect the arrival of contrast agent in a magnetic resonance angiography ("MRA") scan. In all these examples, the data acquisition server 212 acquires MR data and processes it in real-time to produce information that is used to control the scan.

The data processing server 214 receives MR data from the data acquisition server 212 and processes it in accordance with instructions downloaded from the workstation 202. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 214 are conveyed back to the workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the workstation 202. The workstation 202 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a parametric map using a magnetic resonance imaging (MRI) system, the steps of the method comprising:
    a) acquiring k-space data from a subject positioned in a field-of-view using an MRI system;
    b) reconstructing a series of images from the k-space data acquired in step a);
    c) producing a parametric map using the series of images reconstructed in step b);
    d) producing a confidence map from the k-space data, the confidence map depicting regions in the field-of-view that are affected by error sources; and
    e) modifying the parametric map using the confidence map produced in step d) to identify regions in the parametric map that are affected by error sources.

2. The method as recited in claim 1 in which step c) includes producing the confidence map from the series of images reconstructed in step b) from the k-space data acquired in step a).

3. The method as recited in claim 2 in which the confidence map is produced in step c) by:
    i) fitting the series of images reconstructed in step b) to a signal model to produce residual values indicative of a goodness of fit between the series of images and the signal model;
    ii) identifying regions in the imaging field-of-view associated with residual values that exceed a defined threshold value; and
    iii) assigning binary values in the confidence map to the regions identified in step c)ii).

4. The method as recited in claim 1 in which step e) includes producing an image mask using the confidence map and applying the image mask to the parametric map to mask regions that are affected by error sources.

5. The method as recited in claim 1 in which step e) includes displaying the confidence map produced in step c) as overlaid on the parametric map produced in step e).

6. The method as recited in claim 5 in which step e) includes color-coding the confidence map based values in the confidence map.

7. The method as recited in claim 1 in which the confidence map is produced in step c) by:
    i) generating a field map indicative of magnetic field values in the field-of-view associated with a main magnetic field of the MRI system;

ii) identifying regions in the field map depicting magnetic field variations that are rapid relative to a spatial resolution of the acquired k-space data; and iii) assigning binary values in the confidence map to the regions identified in step c)ii).

8. The method as recited in claim 1 in which the confidence map is produced in step c) by:

i) calculating a transverse relaxation rate, $R^*_2$, in the field-of-view from the acquired k-space data;

ii) estimating at least one of a bias and a variance of the transverse relaxation rate for acquisition parameters used in step a) to acquire the k-space data; and iii) assigning binary values in the confidence map to regions associated with at least one of estimated bias and estimated variance above a predetermined bound value.

9. The method as recited in claim 8 in which step c)ii) includes estimating a variance using a Cramer-Rao bound analysis.

10. A method for producing a parametric map using a magnetic resonance imaging (MRI) system, the steps of the method comprising:

a) acquiring k-space data from a subject positioned in a field-of-view using an MRI system;

b) reconstructing a series of images from the k-space data acquired in step a);

c) producing a confidence map from the k-space data, the confidence map depicting regions in the field-of-view that are affected by error sources;

d) producing a parametric map using the series of images reconstructed in step b) and the confidence map produced in step c);

wherein values in the parametric map associated with regions in the field-of-view depicted in the confidence map as being affected by error sources are not computed.

11. The method as recited in claim 10 in which step c) includes producing the confidence map from the series of images reconstructed in step b) from the k-space data acquired in step a).

12. The method as recited in claim 11 in which the confidence map is produced in step c) by:

i) fitting the series of images reconstructed in step b) to a signal model to produce residual values indicative of a goodness of fit between the series of images and the signal model;

ii) identifying regions in the imaging field-of-view associated with residual values that exceed a defined threshold value; and iii) assigning binary values in the confidence map to the regions identified in step c)ii).

* * * * *